(12) United States Patent
Zaka et al.

(10) Patent No.: US 10,644,152 B1
(45) Date of Patent: May 5, 2020

(54) BURIED-CHANNEL LOW NOISE TRANSISTORS AND METHODS OF MAKING SUCH DEVICES

(71) Applicant: GLOBALFOUNDRIES Inc., Grand Cayman (KY)

(72) Inventors: Alban Zaka, Dresden (DE); Luca Pirro, Dresden (DE); Tom Herrmann, Dresden (DE); El Mehdi Bazizi, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/258,857

(22) Filed: Jan. 28, 2019

(51) Int. Cl.
H01L 29/78 (2006.01)
H01L 29/10 (2006.01)

(52) U.S. Cl.
CPC ...... *H01L 29/7838* (2013.01); *H01L 29/1033* (2013.01)

(58) Field of Classification Search
CPC .................. H01L 29/7838; H01L 29/1033
See application file for complete search history.

(56) References Cited

U.S. PATENT DOCUMENTS

| | | | |
|---|---|---|---|
| 9,502,505 B2 | 11/2016 | Liu et al. | |
| 9,972,721 B1 | 5/2018 | Richter et al. | |
| 10,049,917 B2 | 8/2018 | Steinmann et al. | |
| 10,062,713 B1 | 8/2018 | Smith | |
| 2005/0112811 A1 | 5/2005 | Hsu et al. | |
| 2014/0027854 A1 | 1/2014 | Asenov | |
| 2016/0268424 A1 | 9/2016 | Morgan | |

OTHER PUBLICATIONS

Pirro et al., "RTN and LFN Noise Performance in Advanced FDSOI Technology".
Stefanov et al., "Performance of Deep-Depletion Buried-Channel n-MOSFETs for CMOS Image Sensors," IEEE Transactions on Electron Devices, 60:4173-79, Dec. 2013.
Yonezawa et al., "Statistical Analysis of Random Telegraph Noise Reduction Effect by Separating Channel From the Interface," 2012 IEEE.

*Primary Examiner* — Anthony Ho
(74) *Attorney, Agent, or Firm* — Amerson Law Firm, PLLC

(57) ABSTRACT

One illustrative integrated circuit product disclosed herein includes at least one transistor formed on an active region of on an SOI substrate, the transistor comprising a gate that includes a gate structure, first and second source/drain regions positioned on opposite sides of the gate, the first and second source/drain regions comprising doped epitaxial semiconductor material that is doped with a dopant material of a first type, and a doped region positioned below the gate, wherein the doped region has a lateral width that is at least substantially equal to the CPP (contact-poly-pitch) dimension of the transistor and is doped with a dopant material of the first type, wherein a first portion of the doped region is positioned vertically above an interface between the active region and a buried insulation layer of the SOI substrate and a second portion of the doped region is positioned vertically below the interface.

20 Claims, 18 Drawing Sheets

BURIED-CHANNEL LOW NOISE TRANSISTORS AND METHODS OF MAKING SUCH DEVICES

BACKGROUND

Field of the Disclosure

Generally, the present disclosure relates to various embodiments of novel buried-channel low noise transistor devices and various novel methods of making such devices.

Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices.

Device designers are under constant pressure to increase the operating speed and electrical performance of transistors and integrated circuit products that employ such transistors. Device designers are under constant pressure to reduce random telegraph noise (RTN) generation in certain devices and products. RTN is believed to be caused by recombination of the current carriers in the channel region of a transistor device with traps in the gate insulation layer (e.g., silicon dioxide) of the transistor device. Performance metrics such as current fluctuation ($S_{Id}/I_d^2$), voltage fluctuation ($S_{Vg}$ which is approximately equal to $S_{Id}/g_m^2$) and transconductance ($g_m$) are modeled or measured in an effort to access RTN generation in transistor devices. Typical prior art techniques that have been employed or tried in an effort to control or reduce RTN include improving the quality of the interface between the gate insulation layer and the channel semiconductor material in an effort to decrease the number of traps; increase the transconductance ($g_m$) of the device; and/or decrease the interaction between the charge carriers and the traps. RTN generation remains a problem with respect to at least some transistor devices and some applications.

The present disclosure is directed to various embodiments of novel buried-channel low noise transistor devices and various novel methods of making such devices that may avoid, or at least reduce, the effects of one or more of the problems identified above.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various embodiments of novel buried-channel low noise transistor devices and various novel methods of making such devices. One illustrative integrated circuit product disclosed herein comprises at least one transistor formed on an active region of an SOI substrate, the transistor comprising a gate that includes a gate structure, first and second source/drain regions positioned on opposite sides of the gate, the first and second source/drain regions comprising doped epitaxial semiconductor material that is doped with a dopant material of a first type, and a doped region positioned below the gate, wherein the doped region has a lateral width that is at least substantially equal to the CPP (contact-poly-pitch) dimension of the transistor and is doped with a dopant material of the first type, wherein a first portion of the doped region is positioned vertically above an interface between the active region and a buried insulation layer of the SOI substrate and a second portion of the doped region is positioned vertically below the interface.

BRIEF DESCRIPTION OF THE DRAWINGS

The disclosure may be understood by reference to the following description taken in conjunction with the accompanying drawings, in which like reference numerals identify like elements, and in which.

Figure 1:
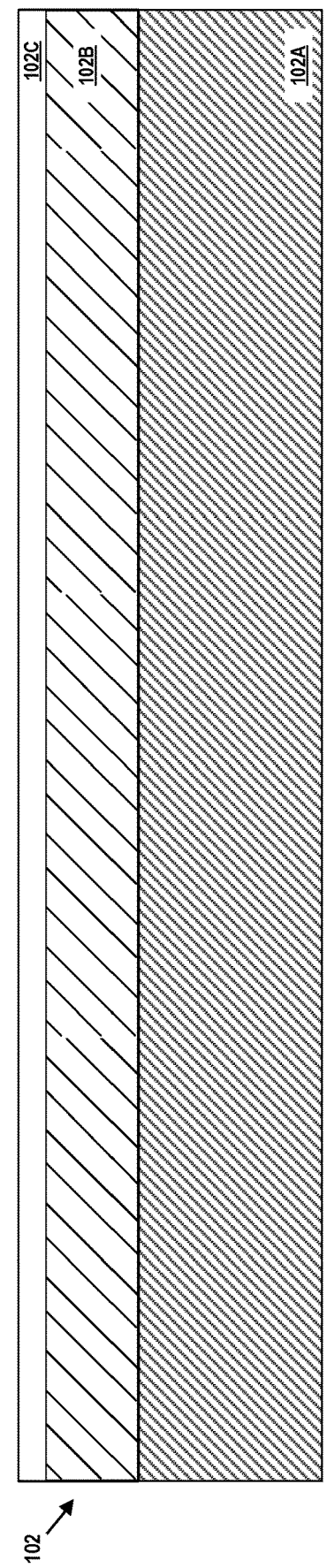
FIGS. 1-18 depict various embodiments of novel buried-channel low noise transistor devices disclosed herein and various novel methods of making such devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the methods disclosed herein may be employed in manufacturing a variety of different devices, including, but not limited to, logic devices, memory devices, etc., and the devices may be may be either NFET or PFET devices. As will also be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the devices and integrated circuit products disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-18 depict various embodiments of novel buried-channel low noise transistor devices and various novel methods of making such devices on a novel integrated circuit product 100. FIG. 1 depicts an illustrative SOI (semiconductor-on-insulator) structure 102 that may be employed in manufacturing the devices disclosed herein. In general, the SOI structure 102 is comprised of a base semiconductor substrate 102A, a buried insulation layer 102B (sometime referred to as a "BOX" layer when the buried insulation layer comprises silicon dioxide) and an active layer 102C comprised of a semiconducting material. Traditionally, and in one illustrative embodiment, the base semiconductor substrate 102A may comprise silicon, the buried insulation layer 102B may comprise silicon dioxide and the active layer 102C may comprise silicon. Of course, the base semiconductor substrate 102A and the active layer 102C may be made of any of a variety of different semiconductor materials, and the materials for the base semiconductor substrate 102A and the active layer 102C need not be made of the same material in all applications, but such a situation may occur in some applications. Similarly, the buried insulation layer 102B may be comprised of a variety of different insulating materials. The thickness of the layers of the SOI substrate 102 may vary depending upon the particular application. In one illustrative embodiment, the active layer 102C may be about 5-20 nm thick and, as initially supplied, the active layer 102C may be substantially free of dopant atoms, with concentrations in the range of or lower than $10^{16}$ ions/cm$^{-3}$. The manner in which such SOI substrates 102 are manufactured are well known to those skilled in the art.

Figure 2:
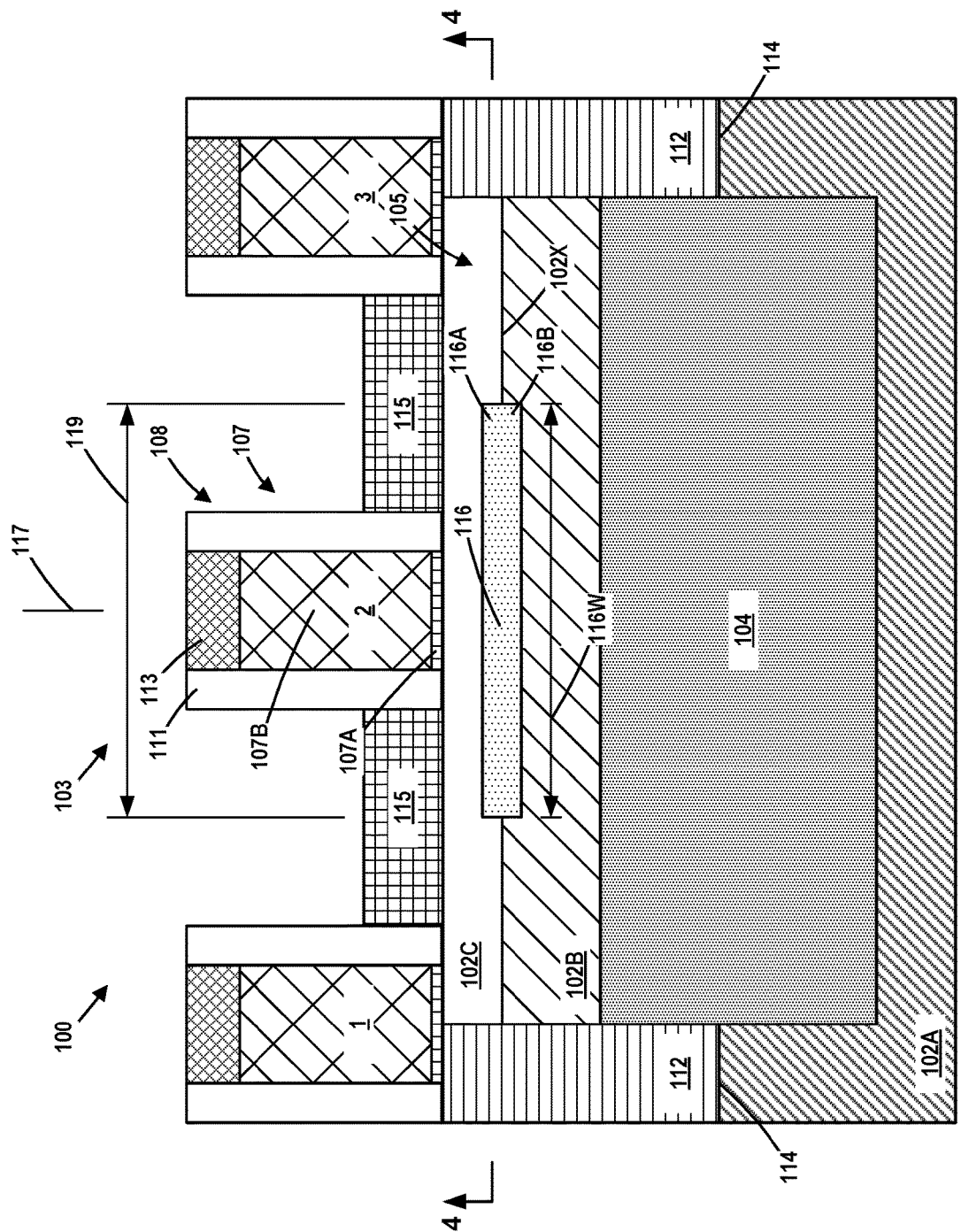

FIG. 2 depicts one illustrative embodiment of a transistor device 103 disclosed herein. Many of the following drawings reflect a cross-sectional view of the substrate 102 and the devices 103 that is taken in the gate-length (GL) direction of the transistor devices 103 that will be formed above the active layer 102C. A gate width (GW) direction of the transistors 103 is orthogonal to the gate length direction, i.e., the gate width direction extends into and out of the plane of the drawing page. The transistors 103 referenced herein and in the attached claims are intended to be representative in nature of any type or form of PFET transistor or NFET transistor that may be formed on an integrated circuit product. In the depicted example, the transistors 103 are depicted as planar transistor devices that are manufactured using gate-first manufacturing techniques.

With reference to FIG. 2, a plurality of isolation structures 112 was formed in the substrate 102 to define an active region 105 in the active layer 102C. In the depicted example, the isolation structures 112 were formed by forming trenches 114 that extend into the base semiconductor substrate 102A, and thereafter overfilling the trenches 114 with an insulating material, e.g., silicon dioxide. The insulating material used for the isolation structures 112 may be the same as or different from the insulation material of the buried insulation layer 102B. At that point, a CMP and/or etch-back process was performed to remove excess amounts of the insulating material of the isolation structures 112 and thereby expose the upper surface of the active region 105.

As noted above, the transistors 103 referenced herein and in the attached claims are intended to be representative in nature. Thus, the particular form, structure or composition of the transistors 103 and the manner in which they are made should not be considered to be a limitation with respect to any of the inventions disclosed herein. The transistors 103 generally comprise a gate structure 107 (that includes an illustrative gate insulation layer 107A and an illustrative gate electrode structure 107B), a sidewall spacer 111 (e.g., silicon nitride), a gate cap 113 (e.g., silicon nitride) and regions of doped epi semiconductor material 115 that are formed in the source/drain regions of the transistors 103. Although only a single spacer 111 is shown in the attached drawings, those skilled in the art will appreciate that multiple sidewall spacers may be formed adjacent the gate structures 107 of the transistor devices 103. The gate 108 of each transistor device 103 comprises at least the gate structure 107, the sidewall spacer(s) 111 and the gate cap 113. Of course, the materials of construction of an NFET and PFET transistor may be different from one another.

The basic components of the transistor devices 103, e.g., the gate structure 107, the spacer(s) 111, the gate cap 113 and the epi semiconductor materials 115 may be manufactured using any of a variety of known manufacturing techniques. In the depicted example, the gate insulation layer 107A may be comprised of a variety of different materials, such as, for example, silicon dioxide, a so-called high-k (k value greater than 10) insulation material, such as, for example hafnium oxide. Similarly, the gate electrode structure 107B may comprise polysilicon and/or one or more layers of metal-containing material, such as, for example, titanium nitride, aluminum, tantalum, etc. In the depicted example, the gate insulation layer 107A may have a thickness of about 0.5-6 nm. In the example depicted herein, the epi semiconductor material 115 for PFET transistors 103 may be silicon-germanium, while the epi semiconductor material 115 for NFET transistors 103 may be silicon-carbon. Additionally, the gate structures 107 may be manufactured using either so-called "gate-first" or "replacement gate" manufacturing techniques.

The transistors 103 may be formed using any desired process flow, the exact nature of which may depend upon the type of devices being constructed, e.g., planar devices, FinFET devices, etc., the materials of construction of the devices and the desired manufacturing technique use to make the devices. Also depicted in FIG. 2 is a deep well implant region 104 that is formed in the base substrate 102A beneath the active region 105. In one illustrative embodiment, the deep well implant 104 may be formed by performing a deep-well ion implantation process after the formation of the isolation structures 112. The deep well regions 104 may be doped with either N- or P-type dopant material, and the dopant concentration in the deep well regions 104 may vary depending upon the particular application.

In general, the active layer 102C (and accordingly the active region 105) is substantially free of dopant atoms (e.g., a concentration in the range of or lower than $10^{16}$ ions/cm$^{-3}$), and thus the devices 103 are sometimes referred to as fully-depleted devices by those skilled in the art. In contrast to prior art devices, the transistors 103 disclosed herein include a shallow doped region 116 positioned beneath the transistor 103. In general, the shallow doped region 116 may be formed by performing a shallow-doping implantation process (described more fully below) prior to the formation of the gates 108 of the transistors 103. For a PFET transistor device 103, the doped region 116 is doped with a P-type dopant such as boron or boron difluoride. For an NFET transistor device 103, the doped region 116 is doped with an N-type dopant such as arsenic or phosphorus. Stated another way, the doped regions 116 are doped with the same type of dopant material as is used to dope the epi source/drain regions 115 of the devices 103, i.e., N-type dopants for NFET devices or P-type dopants for PFET devices. Of course, different N-type dopant species may be used to dope the epi source/drain regions 115 and the doped region 116, e.g., arsenic for the epi regions 115 and phosphorus for the doped region 116 (the same applies to PFET devices as well). As depicted, a first portion 116A of the doped region 116 is positioned vertically above an interface 102X between the active region 102C and the buried insulation layer 102B, while a second portion 116B of the doped region 116 is positioned vertically below the interface 102X. Note that, the active region 105 may be substantially free of doped regions other than the first portion 116A of the doped region 116.

The parameters of the shallow ion implant process that is performed to form the doped regions 116, as well as the concentration of dopant atoms in the resulting doped region 116, may vary depending upon the application. In the case where the doped region 116 is a P-doped region, the shallow ion implant process may be performed using a dopant dose of about $10^{11}$-$10^{14}$ ions/cm$^2$ at an implant energy of about 3-15 eV, so as to result in the P-doped doped region 116 having a dopant concentration of about $10^{17}$-$10^{19}$ ions/cm$^3$. In the case where the doped region 116 is an N-doped region, the shallow ion implant process may be performed using a dopant dose of about $10^{11}$-$10^{14}$ ions/cm$^2$ at an implant energy of about 3-15 eV, so as to result in the N-doped doped region 116 having a dopant concentration of about $10^{17}$-$10^{19}$ ions/cm$^3$.

In the examples in the drawings, the doped region 116 will be simplistically depicted as having a generally rectangular shaped cross-sectional configuration in its as-implanted position, i.e., the approximate position of the implanted dopant atoms in the substrate 102 immediately after the conclusion of the implantation process. In general, the shallow-doping implantation process will be performed such that the target location for the peak concentration of dopant atoms in the doped region 116 will be located at approximately the interface 102X between the active region 102C and the buried insulation layer 102B. As will be appreciated by those skilled in the art, in a real-world device, there will be a distribution of the dopant atoms in the vertical direction (a Gaussian-like distribution). After a complete reading of the present application, those skilled in the art will appreciate that the dopant atoms in the doped region 116 will tend to migrate from their as-implanted position due to various processing operations that are performed to complete the manufacture of the transistors 103 after the formation of the doped regions 116.

Figure 3:
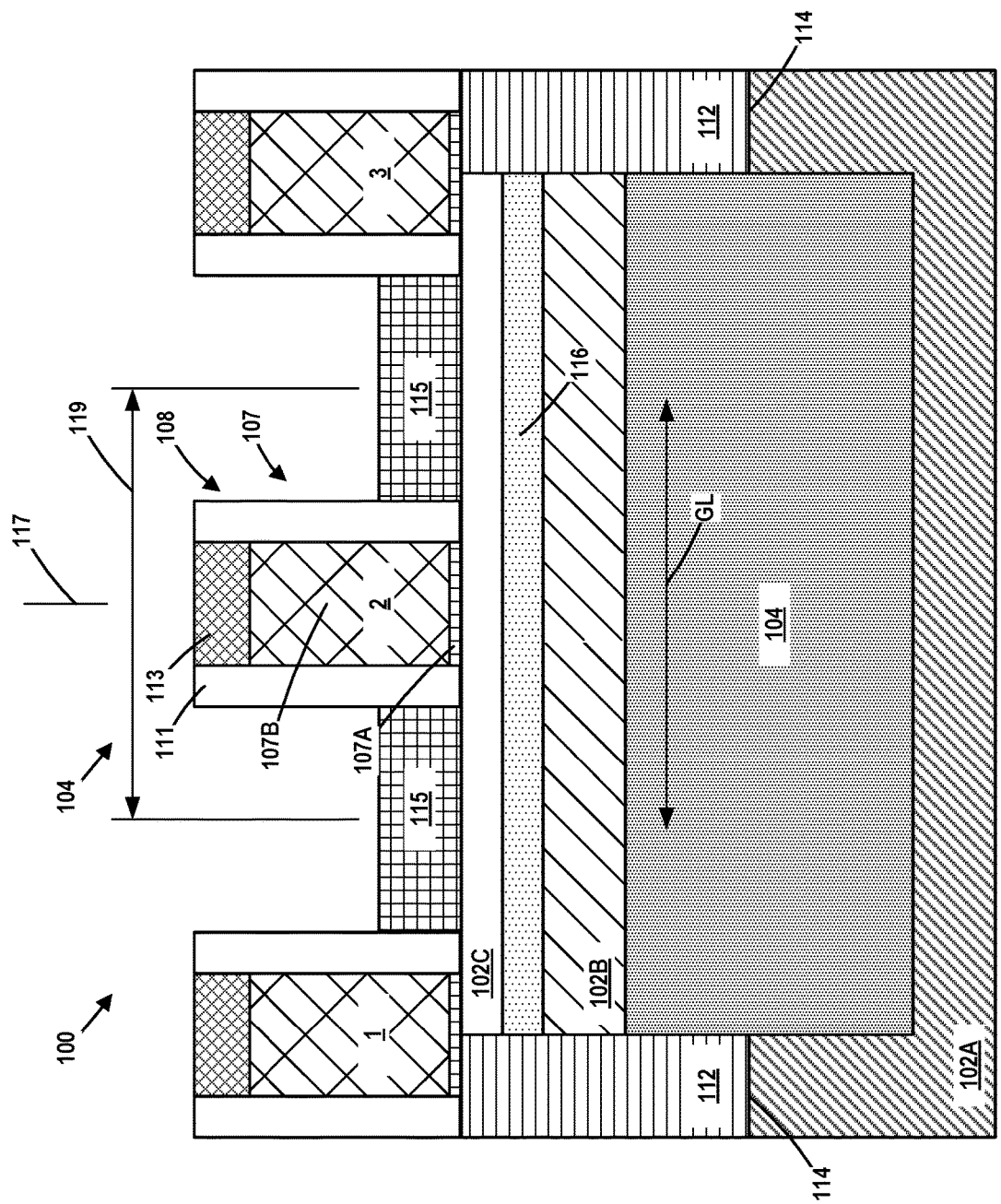
Figure 4:
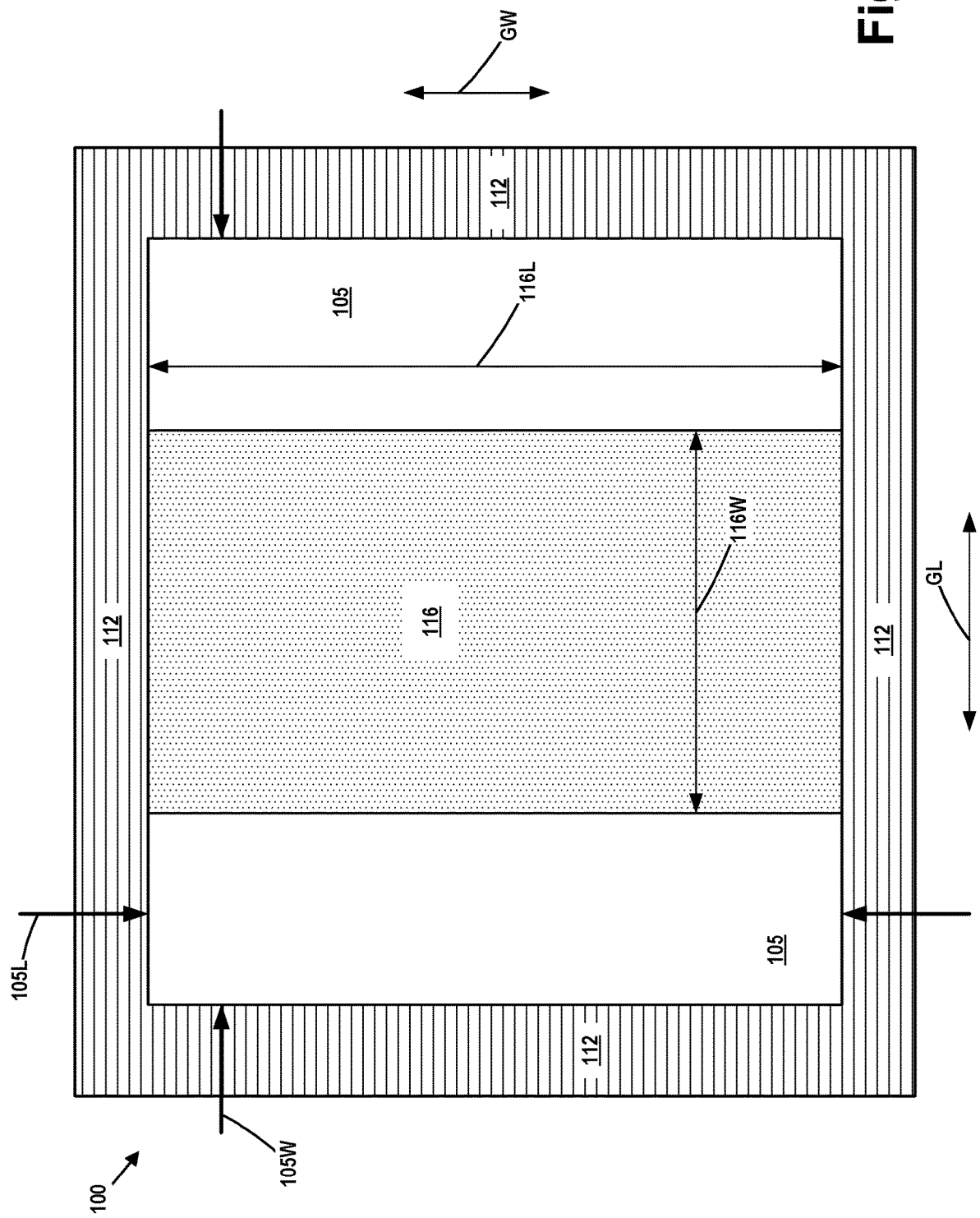

FIG. 4 is a cross-sectional view of the product 100 taken where indicated in FIG. 2—through the active region 105 at a location slightly above the interface 102X. As depicted, in one illustrative embodiment, the active regions 105 disclosed herein may have a generally rectangular configuration when viewed from above. The active region 105 has a width 105W (in the gate length (GL) direction of the device 103) and a length 105L (in the gate width (GW) direction of the device 103). The doped region 116 has a width 116W (in the gate length (GL) direction of the device 103) and a length 116L (in the gate width (GW) direction of the device 103). The absolute value of the dimensions 105L, 105W, 116L an 116W may vary depending upon the particular application. With reference to FIG. 4, in one illustrative example, the doped regions 116 disclosed herein will have a length 116L that extends for substantially the entire length 105L of the active region 105 in the gate width (GW) direction of the device 103. However, the lateral width 116W (in the gate length (GL) direction) of the doped region 116 may vary depending upon the particular application. In some applications, such as that shown in FIG. 2, the doped region 116 may not extend across the entire lateral width 105W of the active region 105. FIG. 3 depicts another embodiment wherein only a single active transistor 103 (gate number 2) was formed above the active region 105. However, in the embodiment shown in FIG. 3, the doped region 116 extends across substantially the entire lateral width 105W of the active region 105.

FIG. 2 depicts the approximate centerline 117 of the gate 108 (number 2) of the single active device 103. Also depicted in FIG. 2 is a dimension 119 that is generally known as the contact-poly-pitch (CPP). The CPP dimension corresponds to the distance between the mid-points of two adjacent poly lines. In a fully depleted SOI technology with raised epitaxial source/drain regions, as shown in the embodiments of the present application, the CPP distance also corresponds to the distance between the approximate mid-point of each of the source/drain regions on opposite sides of the gate 108 of the active device 103. In one illustrative embodiment, such as shown in FIG. 2, wherein the doped region 116 does not extend across the entire lateral width 105W of the active region 105, the lateral width 116W of the doped region 116 (in the gate length direction) may be at least substantially equal to or greater than the CPP dimension. Additionally, in the case where the doped region 116 does not extend across the entire lateral width 105W of the active region 105, a lateral midpoint of the doped region 116 may be substantially vertically aligned with a lateral midpoint or approximate centerline 117 of the gate 108 positioned above the doped region 116. Also note that such raised epitaxial source/drain regions will typically have an upper surface that is positioned at a level that is above a level of an upper surface of the active layer 102C.

Figure 5:
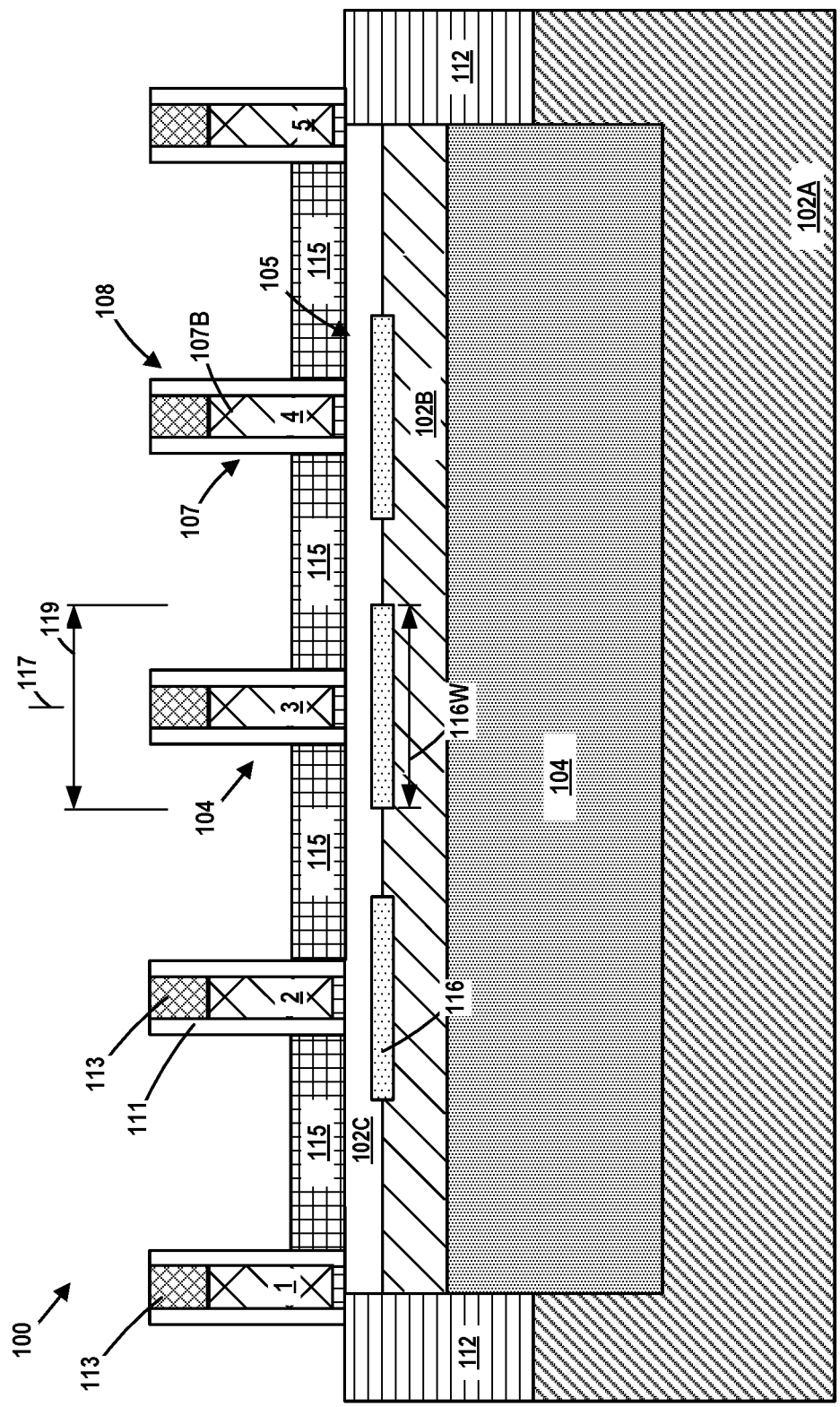

As noted above, any desired number of active transistors 103 may be formed above the active region 105 disclosed herein. FIG. 5 depicts an embodiment where five illustrative gates 108 (labeled with numerals 1-5 for ease of reference) were formed above the active region 105. In this example, the product 100 comprises three active transistors 103 (gates 2-4) formed above the active region 105. In this example, all of the transistors are the same type of transistors, i.e., the transistors 103 are all N-type devices or they are all P-type devices. As before, the tucked gates 1 and 5 are "dummy gates" as it relates to the operation of the three active transistors 103 shown in FIG. 5. In the embodiment depicted in FIG. 5, a lateral midpoint of each of the laterally spaced-apart doped regions 116 may be substantially vertically aligned with a lateral midpoint or approximate centerline 117 of the corresponding gate 108 positioned above each of the laterally spaced-apart doped regions 116. As noted above, each of the doped regions 116 has a lateral width 116W that may be at least substantially equal to or greater than the CPP dimension. The magnitude of the spacing between the laterally spaced-apart doped-regions 116 may vary depending upon the particular application, e.g., 50-500 nm.

Figure 6:
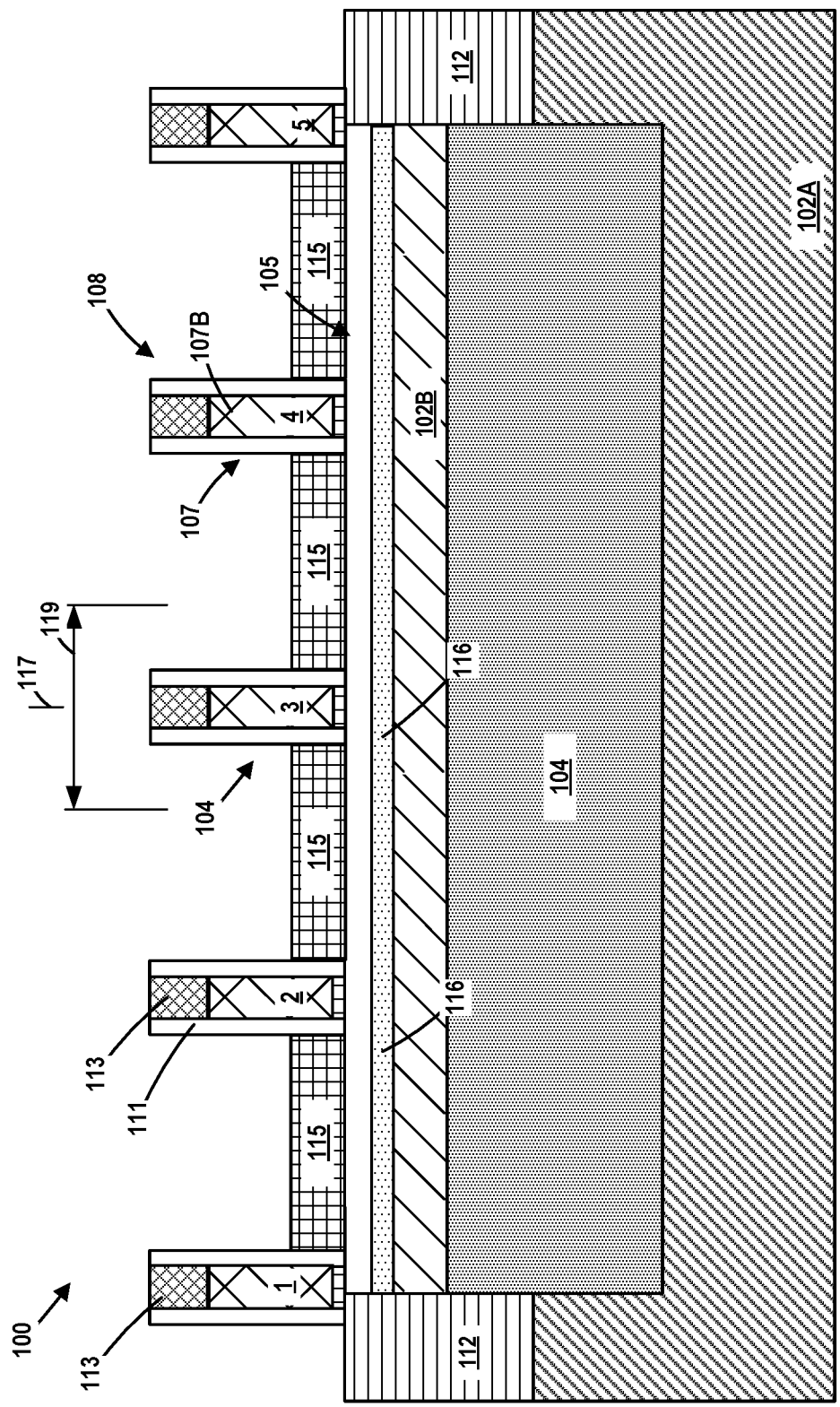

FIG. 6 depicts an embodiment similar to that shown in FIG. 5 wherein five illustrative gates 108 (labeled with numerals 1-5 for ease of reference) were formed above the active region 105. As before, in this example, three active transistors 103 (gates 2-4) are formed above the active region 105. However, in the embodiment shown in FIG. 6 (similar to the embodiment shown in FIG. 3), a unitary doped region 116 extends across substantially the entire lateral width 105W of the active region 105.

Figure 7:
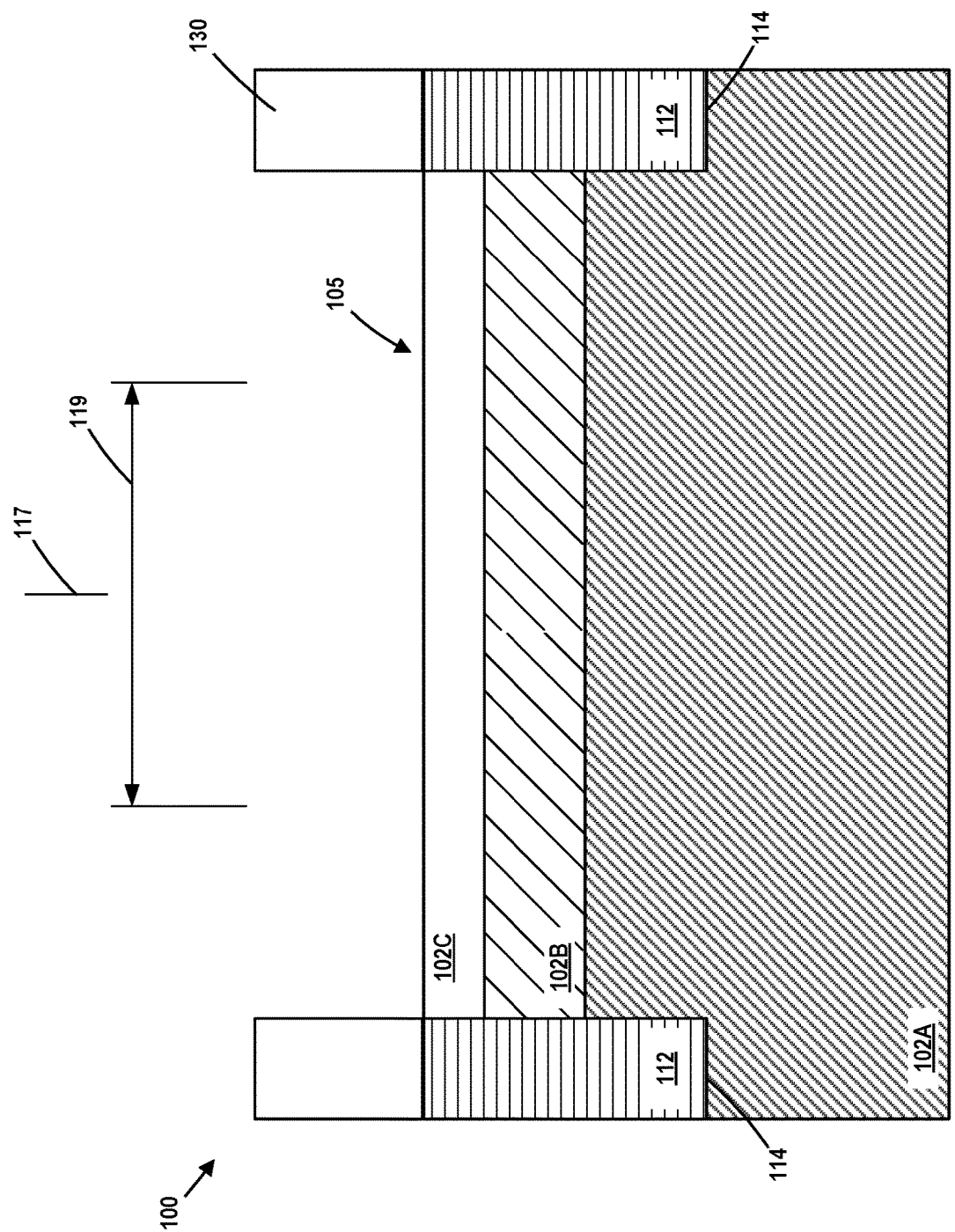
Figure 8:
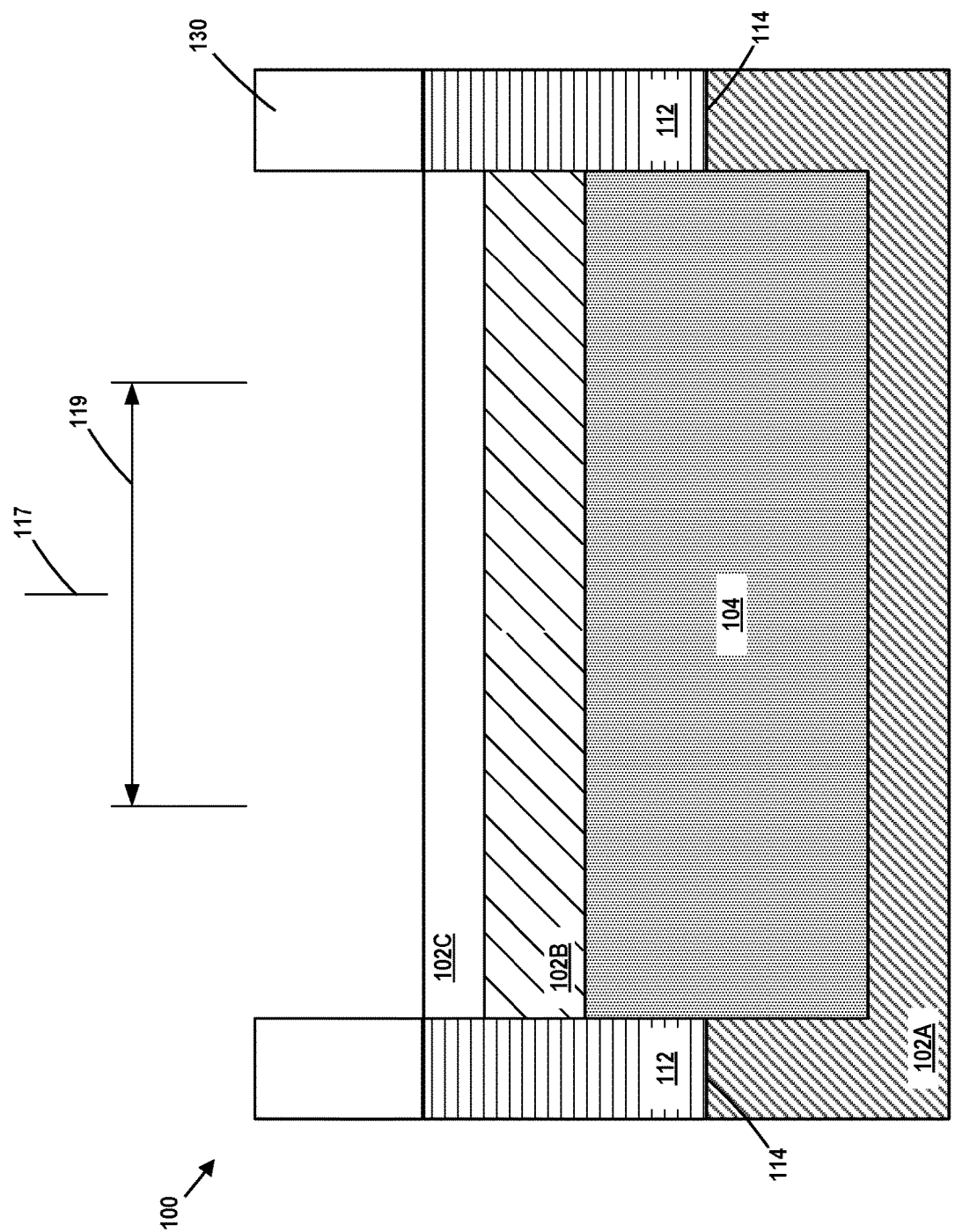
Figure 9:
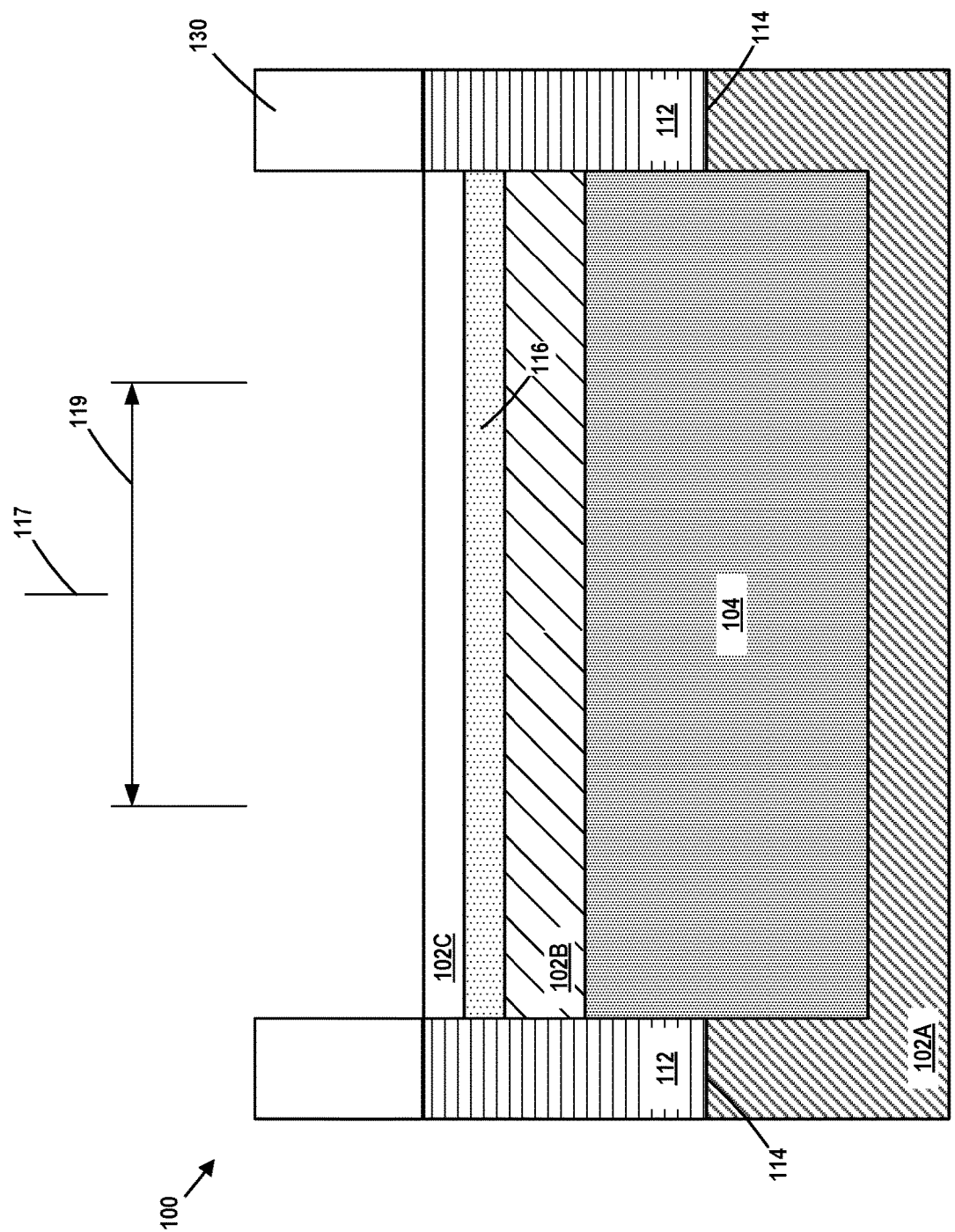

FIGS. 7-9 depict one illustrative process flow for forming the product 100 shown in FIG. 3—the illustrative embodiment wherein the doped region 116 extends across substantially the entire lateral width 105W of the active region 105. FIG. 7 depicts the product after several process operations were performed. First, the above-described isolation regions 112 were formed in the substrate 102 so as to define the active region 105. Thereafter, a patterned deep-well ion implantation mask 130 was formed on the substrate 102. As depicted, the deep-well implant mask 130 exposes the active region 105. The deep-well mask, e.g., a patterned OPL layer or photoresist, was formed on the product 100 by performing traditional manufacturing techniques. Also depicted in FIG. 7 is the approximate centerline 117 of the gate 108 (number 2) of the single active device 103 as well as the CPP dimension 119 for that single active transistor device 103 that will be formed above the active region 105 after the formation of the doped region 116.

FIG. 8 depicts the product 100 after a deep-well ion implantation process was performed to form the illustrative deep-well implant region 104 in the base substrate 102A. As noted above, the deep-well region 104 may be doped with N- or P-type dopants, depending upon the particular application.

As noted above, in this illustrative example, the doped region 116 extends across substantially the entire lateral width 105W of the active region 105. Accordingly, FIG. 9 depicts the product 100 after the above-described shallow ion implantation process was performed through the deep-well implant mask 130 to thereby form the above-described doped region 116. Importantly, the doped region 116 is formed prior to the formation of the gate 108 of the transistor device 103. At that point, the deep-well implant mask 130 may be removed and various process operations may be performed to complete the fabrication of the various devices 103 and structures on the product 100. Of course, if desired, the doped region 116 may be formed prior to the formation of the deep-well region 104.

Figure 10:
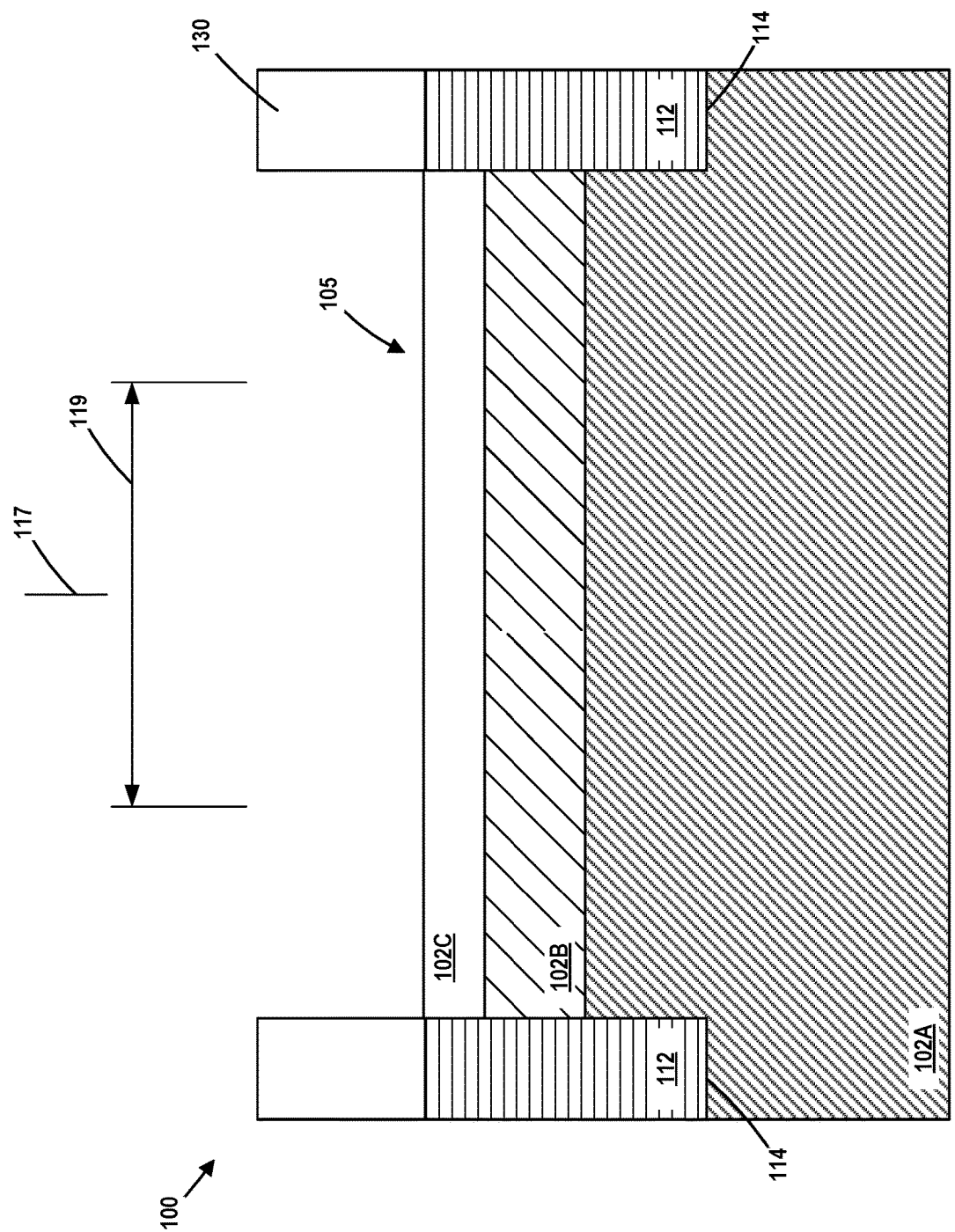
Figure 11:
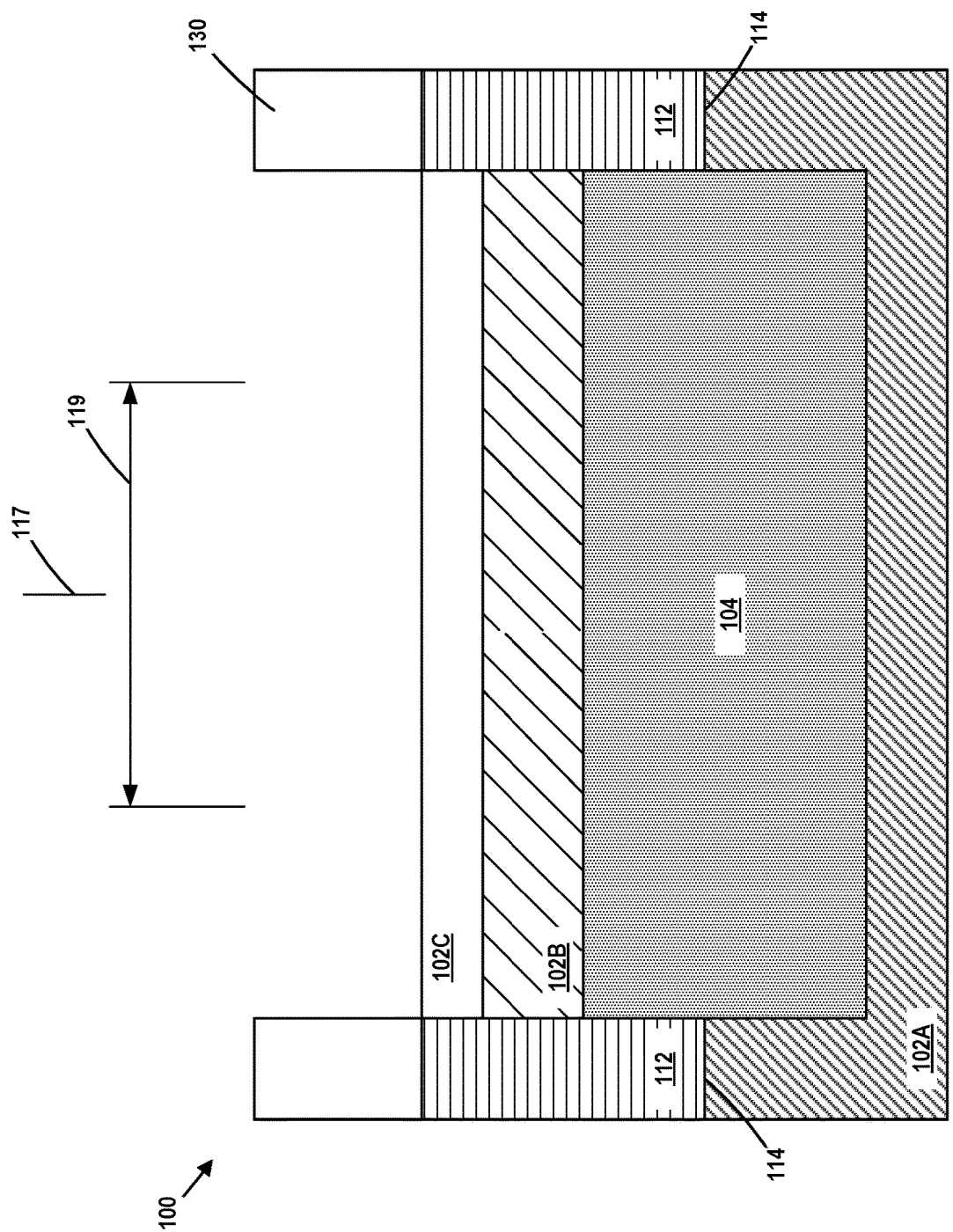
Figure 12:
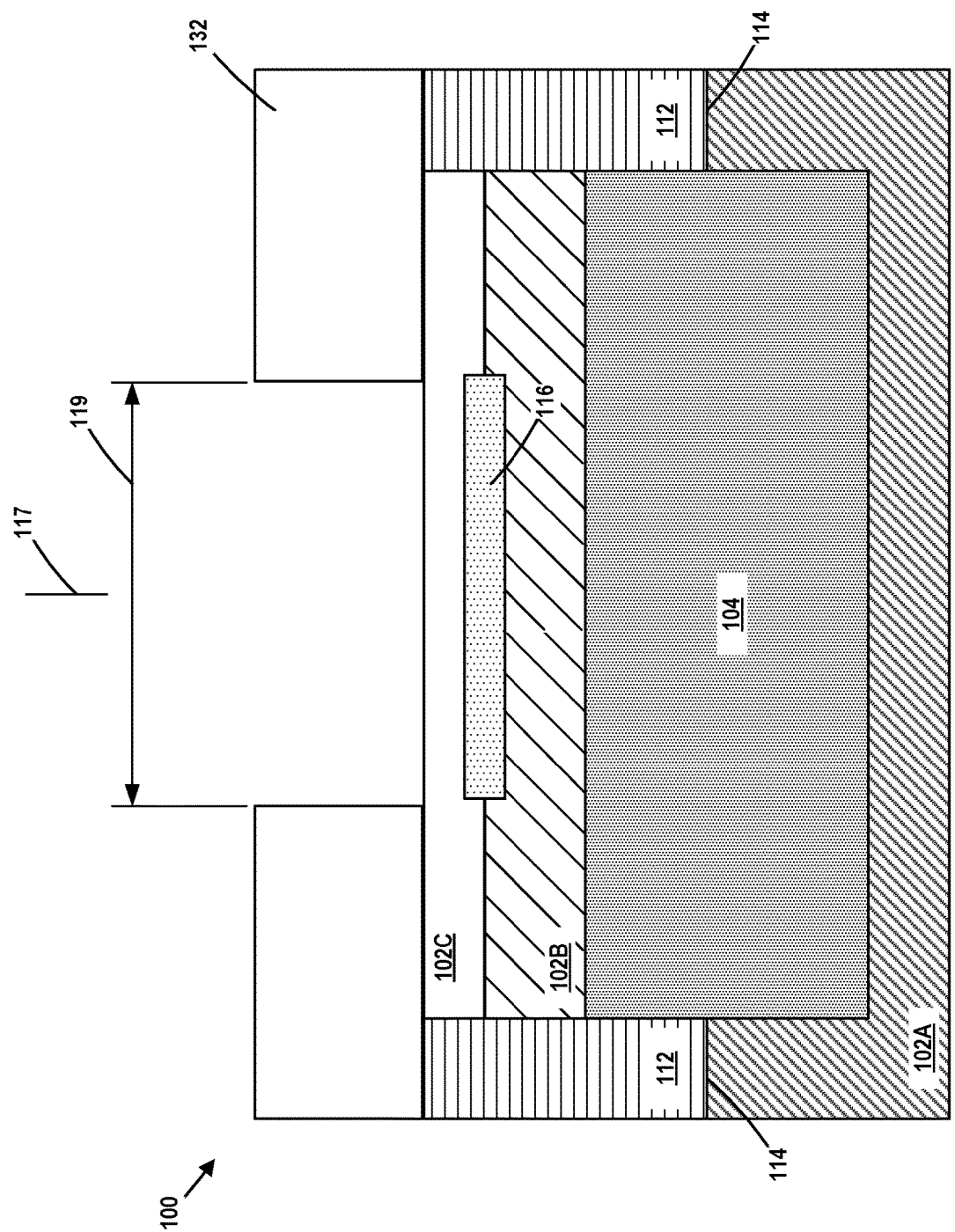

FIGS. 10-12 depict one illustrative process flow for forming the product 100 shown in FIG. 2—the illustrative embodiment wherein the doped region 116 does not extend across the entire lateral width 105W of the active region 105. FIG. 10 depicts the product after several process operations were performed. First, the above-described isolation regions 112 were formed in the substrate 102 so as to define the active region 105. Thereafter, the above-described patterned deep-well ion implantation mask 130 was formed on the substrate 102. As before, the deep-well implant mask 130 exposes the active region 105. Also depicted in FIG. 10 is the approximate centerline 117 of the gate 108 (number 2) of the single active device 103 as well as the CPP dimension 119 for that single active transistor device 103 that will be formed above the active region 105 after the formation of the doped region 116.

FIG. 11 depicts the product 100 after the above-described deep-well ion implantation process was performed to form the illustrative deep-well implant region 104 in the base substrate 102A. As noted above, the deep-well region 104 may be doped with N- or P-type dopants, depending upon the particular application.

As noted above, in this illustrative example, the doped region 116 will not extend across the entire lateral width 105W of the active region 105. Accordingly, FIG. 12 depicts the product 100 after several process operations were performed. First, the above-described deep-well implant mask 130 was removed. Thereafter, a patterned shallow implant mask 132 was formed on the substrate 102. The patterned shallow implant mask 132, e.g., a patterned OPL layer or photoresist, was formed on the product 100 by performing traditional manufacturing techniques. As depicted, the patterned shallow implant mask 132 exposes the portion of the active region 105 below which the doped region 116 will be formed. Thereafter, the above-described shallow ion implantation process was performed through the patterned shallow implant mask 132 to thereby form the above-described doped region 116. Importantly, the doped region 116 is formed prior to the formation of the gate 108 of the transistor device 103. At that point, the patterned shallow implant mask 132 may be removed and various process operations may be performed to complete the fabrication of the various devices 103 and structures on the product 100. As noted above, if desired, the doped region 116 may be formed prior to the formation of the deep-well region 104.

Figure 13:
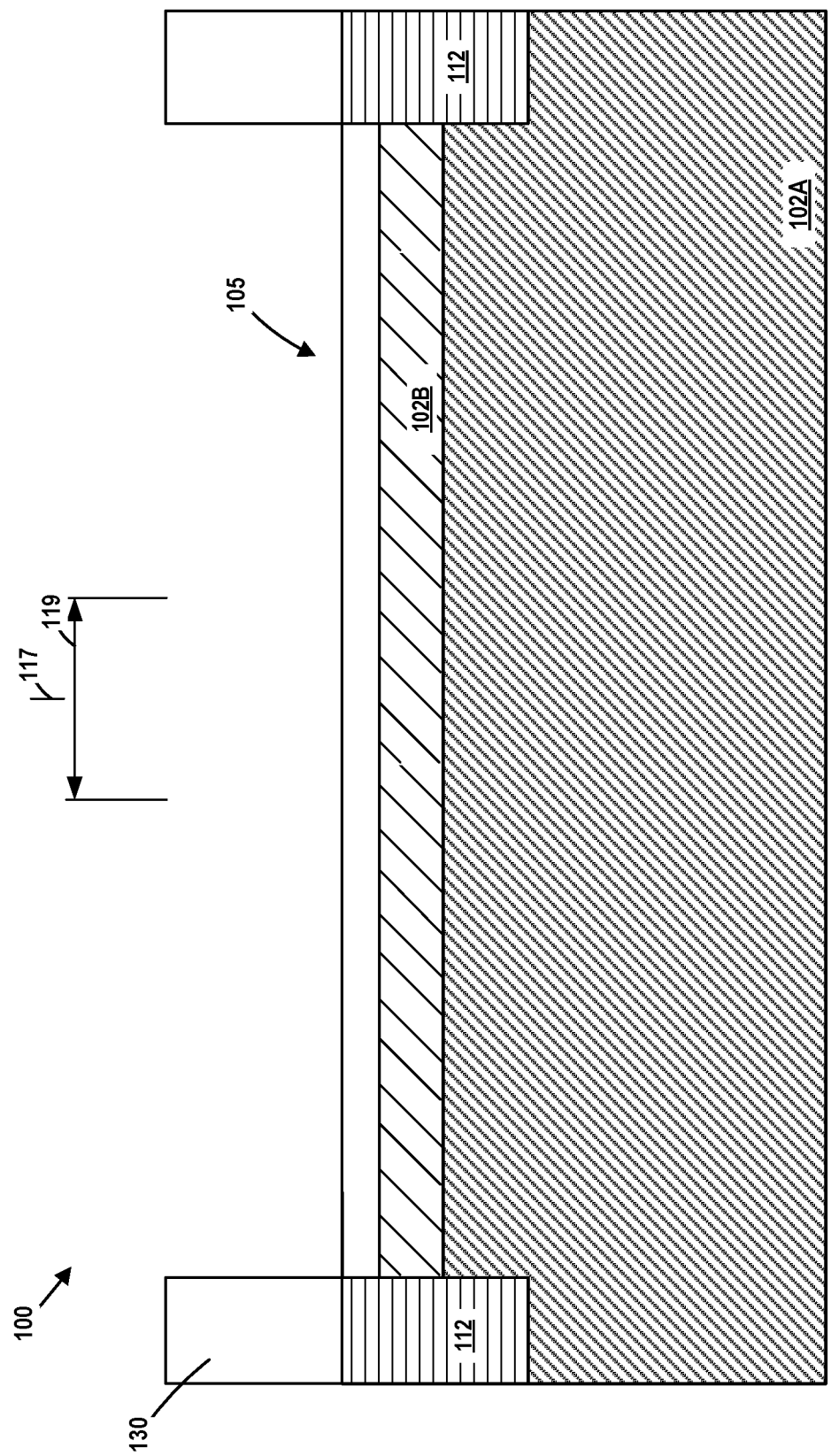
Figure 14:
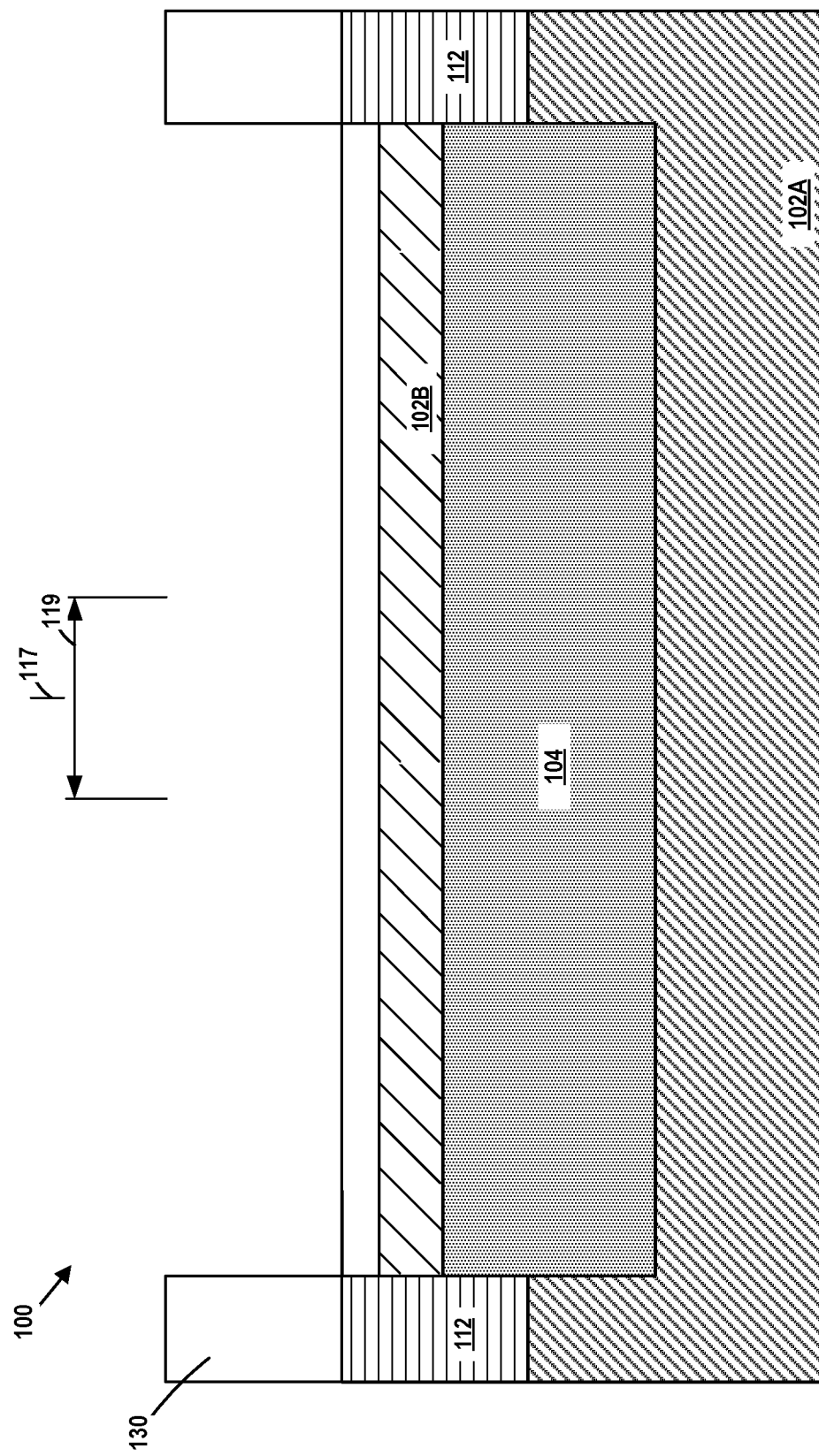
Figure 15:
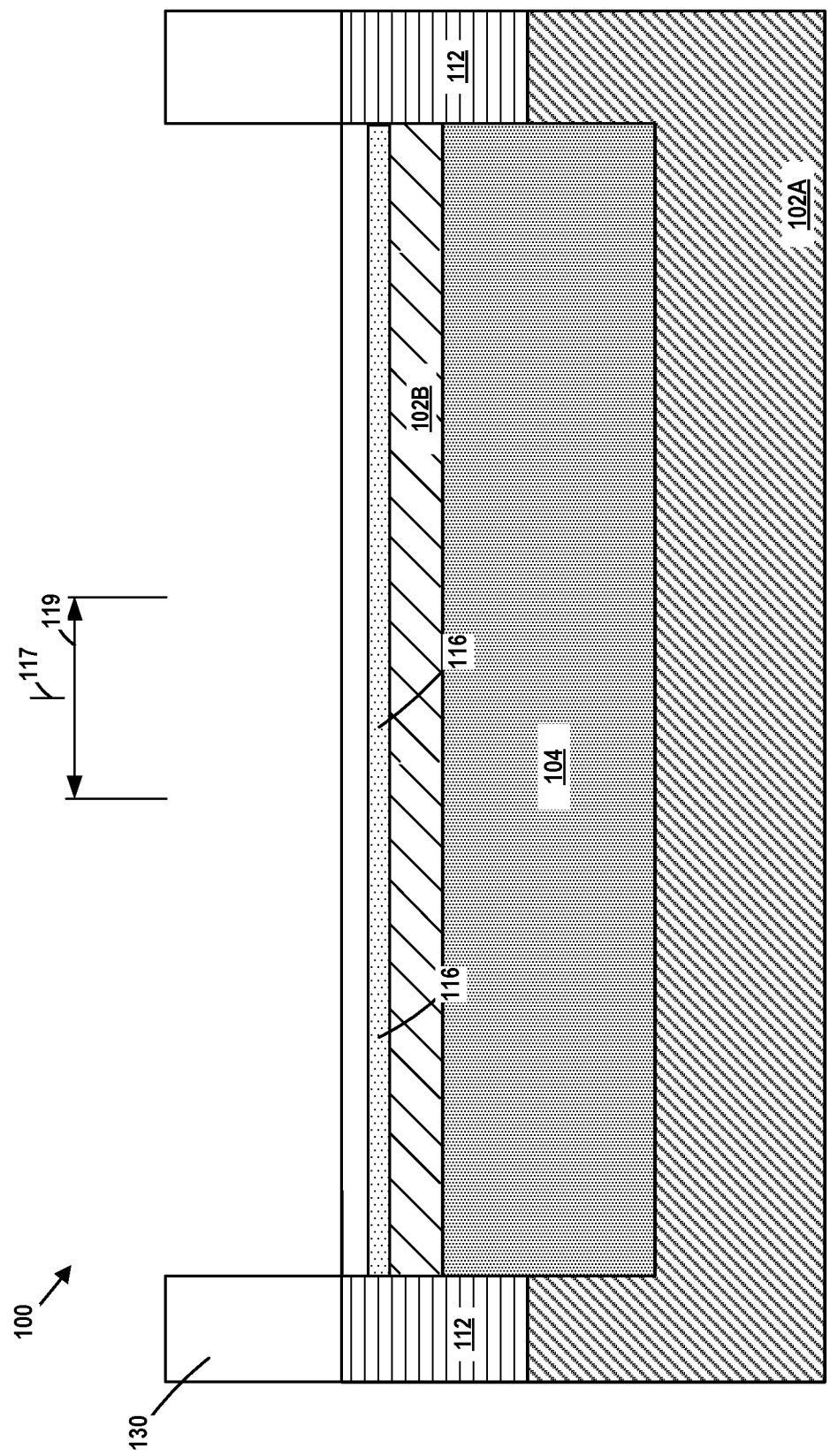

FIG. 13-15 depict one illustrative process flow for forming the product 100 shown in FIG. 6—the illustrative embodiment wherein the doped region 116 extends across substantially the entire lateral width 105W of the active region 105, and wherein all of the transistors 103 formed on the active regions 105 are of the same type. FIG. 13 depicts the product 100 after several process operations were performed. First, the above-described isolation regions 112 were formed in the substrate 102 so as to define the active region 105. Thereafter, the above-described patterned deep-well ion implantation mask 130 was formed on the substrate 102. As depicted, the deep-well implant mask 130 exposes the active region 105. Also depicted in FIG. 13 is the approximate centerline 117 of the gate 108 (number 3) of one of the active devices 103 as well as the CPP dimension 119 for that active transistor device 103 that will be formed above the active region 105 after the formation of the doped region 116.

FIG. 14 depicts the product 100 after a deep-well ion implantation process was performed to form the illustrative deep-well implant region 104 in the base substrate 102A. As noted above, the deep-well region 104 may be doped with N- or P-type dopants, depending upon the particular application.

As noted above, in this illustrative example, the doped region 116 extends across substantially the entire lateral width 105W of the active region 105. Accordingly, FIG. 15 depicts the product 100 after the above-described shallow ion implantation process was performed through the deep-well implant mask 130 to thereby form the above-described doped region 116. At that point, the deep-well implant mask 130 may be removed and various process operations may be performed to complete the fabrication of the various devices 103 and structures on the product 100. Again, if desired, the doped region 116 may be formed prior to the formation of the deep-well region 104.

Figure 16:
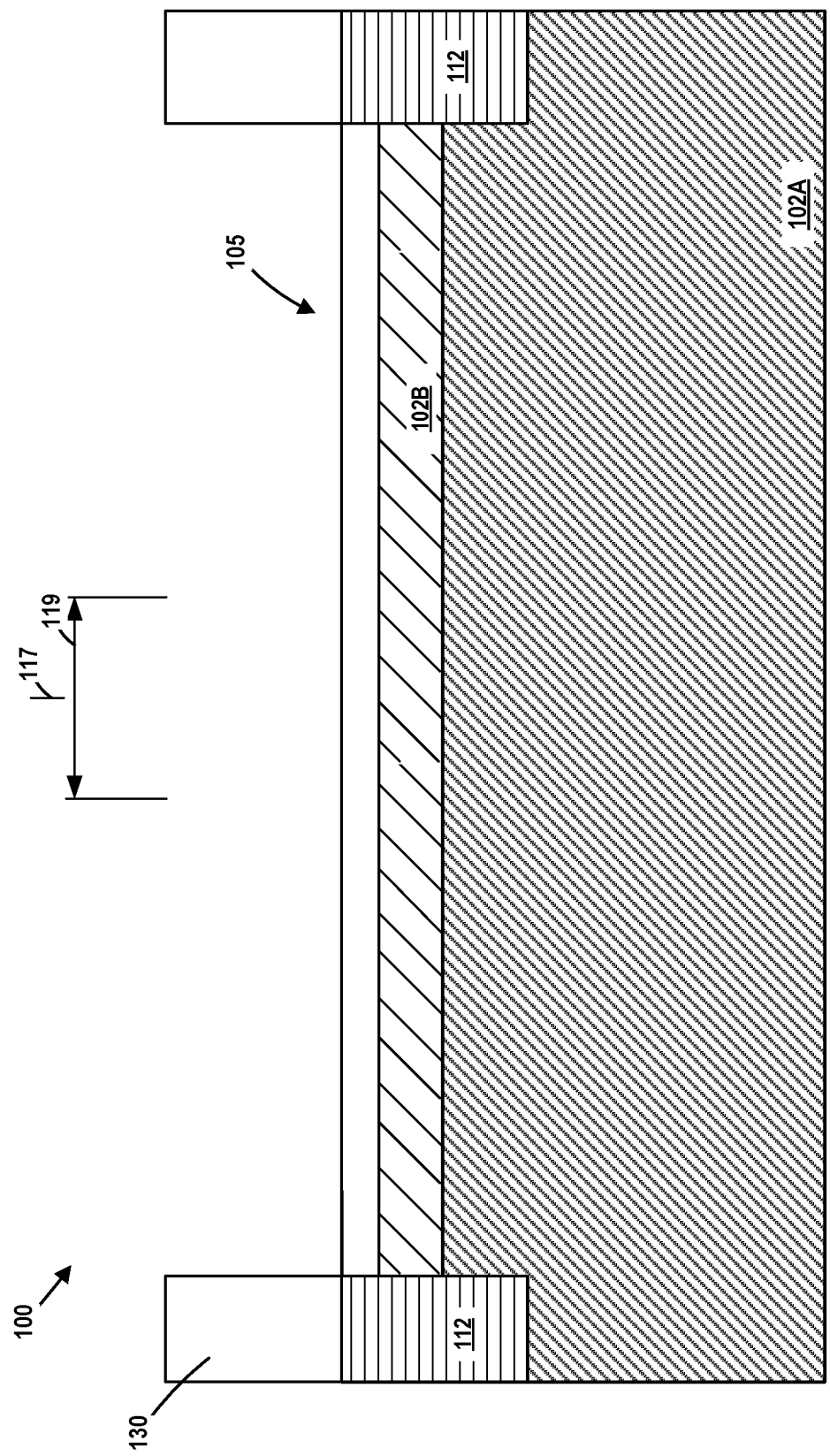
Figure 17:
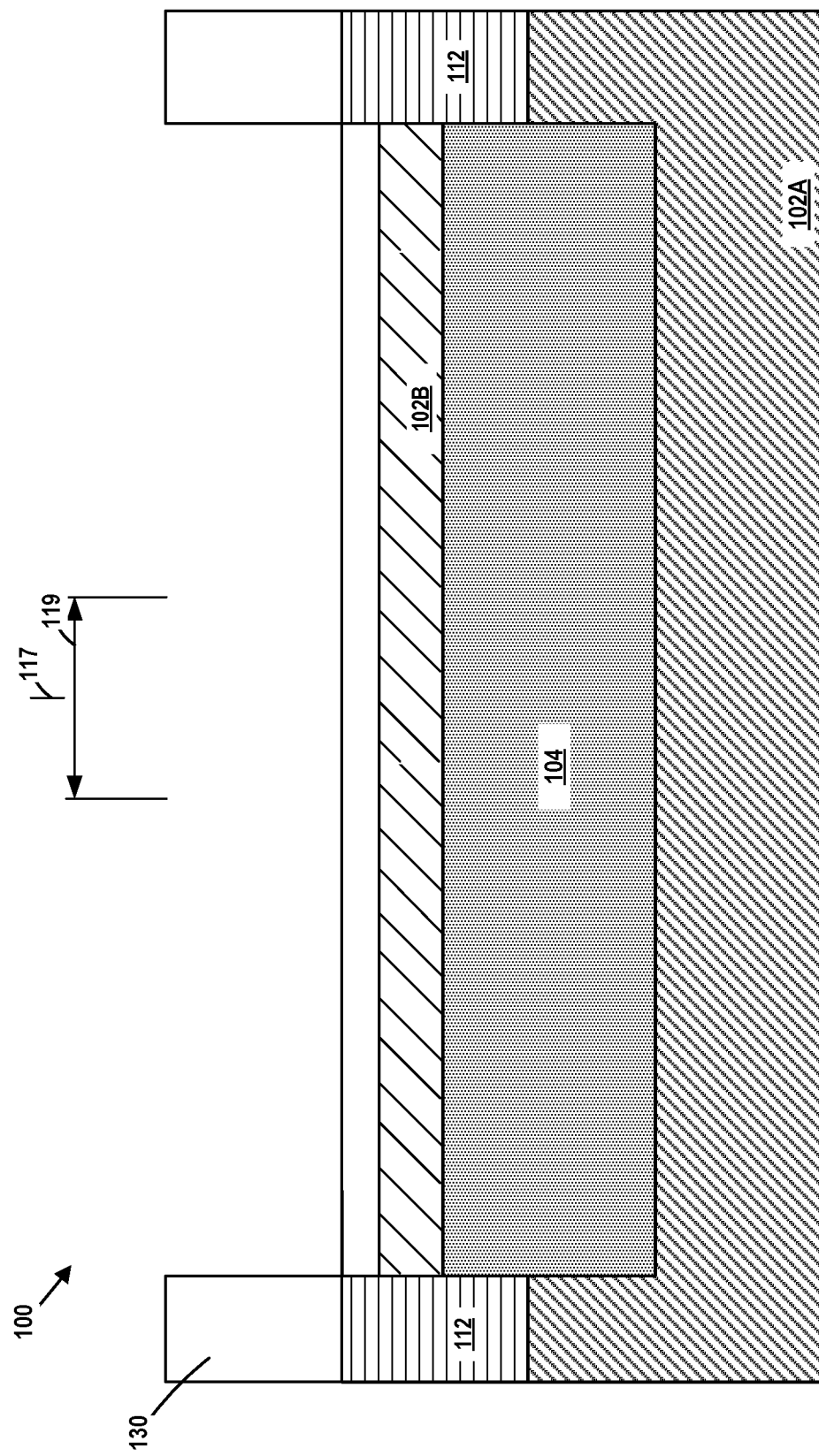
Figure 18:
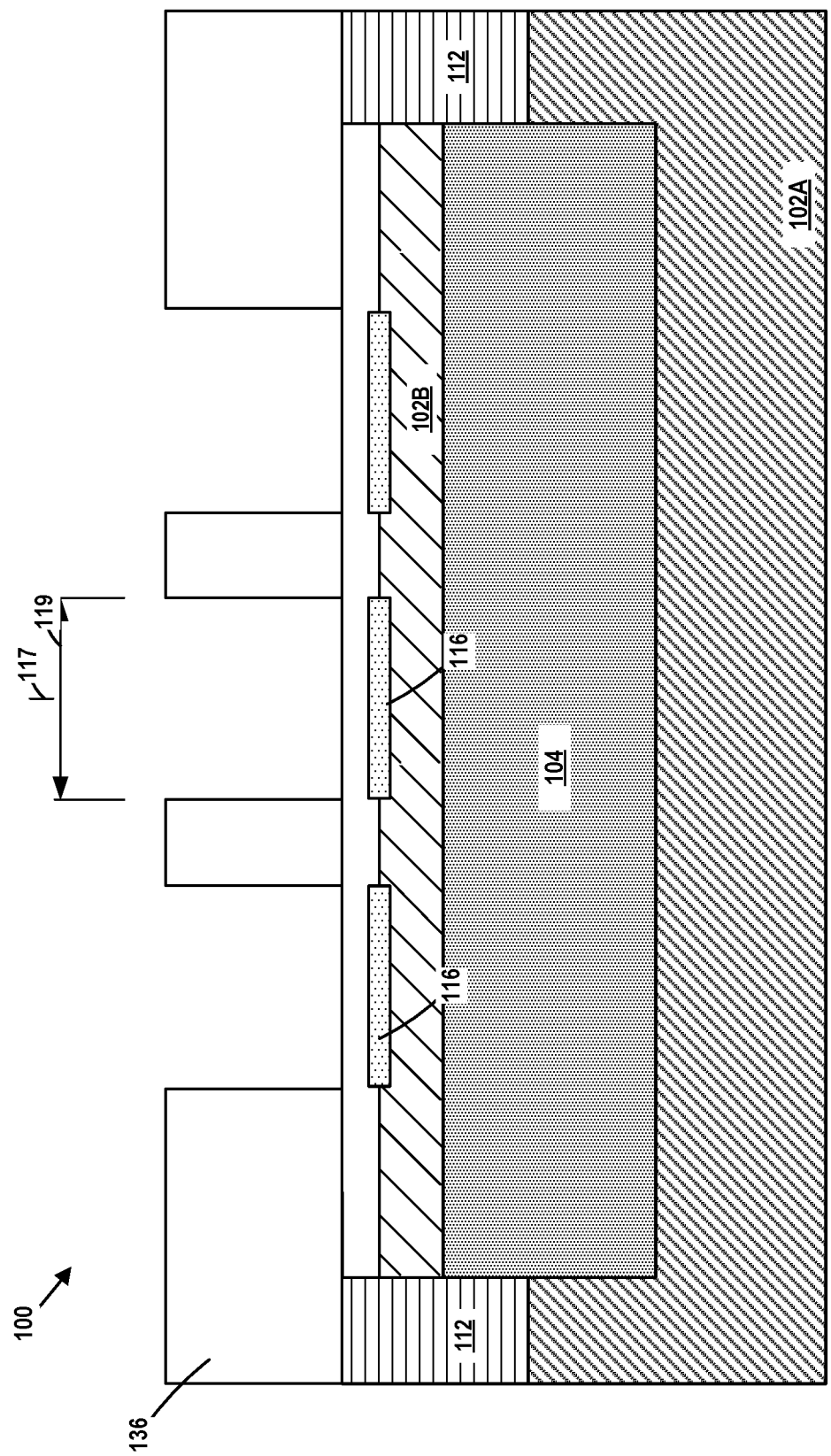

FIGS. 16-18 depict one illustrative process flow for forming the product 100 shown in FIG. 5—the illustrative embodiment wherein there are a plurality of laterally-spaced apart doped regions 116 at appropriate locations across the active region 105, and wherein all of the transistors 103 are of the same type. FIG. 16 depicts the product after several process operations were performed. First, the above-described isolation regions 112 were formed in the substrate 102 so as to define the active region 105. Thereafter, the above-described patterned deep-well ion implantation mask 130 was formed on the substrate 102. As depicted, the deep-well implant mask 130 exposes the active region 105. Also depicted in FIG. 16 is the approximate centerline 117 of the gate 108 (number 3) of one of the active devices 103 as well as the CPP dimension 119 for that active transistor device 103 that will be formed above the active region 105 after the formation of the laterally spaced-apart doped regions 116.

FIG. 17 depicts the product 100 after the above-described deep-well ion implantation process was performed to form the illustrative deep-well implant region 104 in the base substrate 102A. As noted above, the deep-well region 104 may be doped with N- or P-type dopants, depending upon the particular application.

As noted above, in this illustrative example, each of the laterally spaced apart doped regions 116 does not extend across the entire lateral width 105W of the active region 105. Rather, in one embodiment, a lateral midpoint of each of the doped regions 116 is in substantial vertical alignment with a lateral midpoint of the corresponding gate structure 107 of the gate 108 positioned immediately above a particular doped region 116. Accordingly, FIG. 18 depicts the product 100 after several process operations were performed. First, the above-described deep-well implant mask 130 was removed. Thereafter, the above-described patterned shallow implant mask 132 was formed on the substrate 102. As depicted, the patterned shallow implant mask 132 exposes the portions of the product 100 where it is desired to form the laterally separated doped regions 116. Thereafter, the above-described shallow ion implantation process was performed through the patterned shallow implant mask 132 to thereby form the above-described laterally spaced-apart doped regions 116. Importantly, the laterally spaced-apart doped regions 116 were formed prior to the formation of the gates 108 of the transistor devices 103. At that point, the patterned shallow implant mask 132 may be removed and various process operations may be performed to complete the fabrication of the various devices 103 and structures on the product 100. Of course, if desired, the doped regions 116 may be formed prior to the formation of the deep-well region 104.

Modeling performed by the inventors has shown that the formation of the doped regions 116 disclosed herein can reduce random telegraph noise (RTN) and can reduce important noise performance metrics such as current fluctuation ($S_{Id}/I_d^2$) and voltage fluctuation ($S_{Vg}$ which is approximately equal to $S_{Id}/g_m^2$). In one particular example, current fluctuation was reduced by approximately 50%, voltage fluctuation was reduced by approximately 24%, while the value of the transconductance ($g_m$) was reduced by only about 5%. It is believed that formation of the doped region 116 at or near the interface 102X between the active region 102C and the buried insulation layer 102B promote the flow of charge carriers (holes for PFETs and electrons for NFETs) closer to the interface 102X as compared to prior art devices and thereby leads to reduced RTN generation in the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a base semiconductor substrate;
   a buried insulation layer positioned above said base semiconductor layer;
   an active region positioned above said buried insulation layer;
   at least one active transistor positioned in said active region, said at least one active transistor comprising:
      a gate that comprises a gate structure;
      first and second source/drain regions positioned on opposite sides of said gate, said first and second source/drain regions comprising doped epitaxial semiconductor material that is doped with a dopant material of a first type;
      a gate length that extends in a gate length direction; and
      a contact-poly-pitch (CPP) dimension that extends in said gate length direction; and
   a doped region positioned below said gate, said doped region having a lateral width in said gate length direction that is at least substantially equal to said CPP dimension, said doped region being doped with a dopant material of said first type, wherein a first portion of said doped region is positioned vertically above an interface between said active region and said buried insulation layer and a second portion of said doped region is positioned vertically below said interface.

2. The integrated circuit product of claim 1, wherein said gate further comprises:
   a gate cap positioned above said gate structure; and
   at least one sidewall spacer positioned adjacent opposing sidewalls of said gate structure, wherein each of said first and second source/drain regions has a lateral midpoint and wherein said CPP dimension is substantially equal to a distance between said lateral midpoints of said first and second source/drain regions.

3. The integrated circuit product of claim 1, wherein said active region is substantially free of doped regions other than said first portion of said doped region.

4. The integrated circuit product of claim 1, wherein said lateral width of said doped region is substantially equal to said CPP dimension.

5. The integrated circuit product of claim 1, wherein said active region has a lateral width in said gate length direction and wherein said lateral width of said doped region is at least approximately equal to said lateral width of said active region.

6. The integrated circuit product of claim 1, wherein a vertical location of peak dopant concentration of said doped region is positioned at approximately said interface.

7. The integrated circuit product of claim 1, wherein said doped epitaxial semiconductor material is doped with a first dopant species of said first type and said doped region is doped with a second dopant species of said first type, wherein said first and second dopant species are different.

8. The integrated circuit product of claim 1, wherein said at least one active transistor is a planar transistor device and wherein said gate structure comprises a gate insulation layer that comprises at least one of silicon dioxide or a high-k (k value greater than 10) insulation material and a gate electrode structure that comprises at least one of polysilicon, a metal, titanium nitride, aluminum or tantalum, and wherein said doped epitaxial semiconductor material has an upper surface that is positioned at a level that is above a level of an upper surface of said active layer.

9. The integrated circuit product of claim 1, wherein said at least one active transistor is a PFET transistor and said first dopant type is P-type dopant.

10. The integrated circuit product of claim 1, wherein said at least one active transistor consists of a single active transistor, wherein said active region has a lateral width in said gate length direction, and wherein said lateral width of said doped region is less than said lateral width of said active region.

11. The integrated circuit product of claim 10, wherein a lateral midpoint of said doped region is in substantial vertical alignment with a lateral midpoint of said gate of said single active transistor.

12. The integrated circuit product of claim 10, wherein said lateral width of said doped region is at least substantially equal to said CPP dimension.

13. The integrated circuit product of claim 1, wherein said at least one active transistor consists of a single active transistor, wherein said active region has a lateral width in said gate length direction, and wherein said lateral width of said doped region is at least approximately equal to said lateral width of said active region.

14. The integrated circuit product of claim 1, wherein said at least one active transistor comprises a plurality of active transistors that are all of a same type, wherein said integrated circuit product comprises a plurality of laterally spaced-apart doped regions, each of said doped regions being positioned below said gate of a corresponding one of said plurality of active transistors, wherein a lateral midpoint of each of said doped regions is in substantial vertical alignment with a lateral midpoint of said gate of said corresponding active transistor that is positioned above said doped region.

15. The integrated circuit product of claim 14, further comprising a lateral space in said active regions between adjacent laterally-spaced apart doped regions, said lateral space being substantially free of dopant material.

16. The integrated circuit product of claim 15, wherein a lateral width of each of said plurality of doped regions is at least substantially equal to said CPP dimension.

17. The integrated circuit product of claim 1, wherein said at least one active transistor comprises a plurality of active transistors that are all of a same type, wherein said active region has a lateral width in said gate length direction, and wherein said lateral width of said doped region is at least approximately equal to said lateral width of said active region.

18. An integrated circuit product, comprising:
a base semiconductor substrate;
a buried insulation layer positioned above said base semiconductor layer;
an active region positioned above said buried insulation layer;
a transistor positioned in said active region, said transistor comprising:
a gate that comprises a gate structure;
first and second source/drain regions positioned on opposite sides of said gate, said first and second source/drain regions comprising doped epitaxial semiconductor material that is doped with a dopant material of a first type;
a gate length that extends in a gate length direction, wherein said active region has a lateral width in said gate length direction; and
a contact-poly-pitch (CPP) dimension that extends in said gate length direction; and
a doped region positioned below said gate, said doped region having a lateral width in said gate length direction that is at least substantially equal to said CPP dimension but less than said lateral width of said active region, said doped region being doped with a dopant material of said first type, wherein a first portion of said doped region is positioned vertically above an interface between said active region and said buried insulation layer and a second portion of said doped region is positioned vertically below said interface, wherein a lateral midpoint of said doped region is in substantial vertical alignment with a lateral midpoint of said gate of said transistor.

19. The integrated circuit product of claim 18, wherein said transistor is a planar transistor device and wherein said gate structure comprises a gate insulation layer that comprises at least one of silicon dioxide or a high-k (k value greater than 10) insulation material and a gate electrode structure that comprises at least one of polysilicon, a metal, titanium nitride, aluminum or tantalum.

20. The integrated circuit product of claim 18, wherein said active region is substantially free of doped regions other than said first portion of said doped region and wherein a vertical location of peak dopant concentration of said doped region is positioned at approximately said interface.

* * * * *